(12) United States Patent
Yoshikawa

(10) Patent No.: US 7,474,083 B2
(45) Date of Patent: *Jan. 6, 2009

(54) SEMICONDUCTOR DEVICE

(75) Inventor: Noriaki Yoshikawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/828,395

(22) Filed: Jul. 26, 2007

(65) Prior Publication Data

US 2007/0262762 A1 Nov. 15, 2007

Related U.S. Application Data

(63) Continuation of application No. 11/513,120, filed on Aug. 31, 2006, now Pat. No. 7,265,526.

(30) Foreign Application Priority Data

Sep. 6, 2005 (JP) ............................. 2005-258180

(51) Int. Cl.
*G05F 1/40* (2006.01)
(52) U.S. Cl. ...................... 323/282; 323/285
(58) Field of Classification Search ................ 323/282, 323/283, 284, 285, 288, 290
See application file for complete search history.

(56) References Cited

U.S. PATENT DOCUMENTS

| 6,320,359 | B1 | 11/2001 | Nagaya et al. |
| 6,580,627 | B2 | 6/2003 | Toshio |
| 6,674,268 | B2 | 1/2004 | Rutter et al. |
| 6,858,996 | B2 | 2/2005 | Green |
| 6,870,354 | B2 | 3/2005 | Nishimaki |
| 6,897,682 | B2 | 5/2005 | Nadd |
| 6,903,590 | B2 | 6/2005 | Indoh |
| 6,979,981 | B2 | 12/2005 | Yoshikawa |
| 7,166,992 | B2 | 1/2007 | Kudo et al. |
| 7,166,993 | B2 | 1/2007 | Shimizu et al. |
| 7,199,568 | B2 | 4/2007 | Matsuo et al. |
| 7,265,526 | B2 * | 9/2007 | Yoshikawa .................. 323/282 |
| 2006/0055432 | A1 | 3/2006 | Shimokawa et al. |
| 2006/0220629 | A1 | 10/2006 | Saito et al. |
| 2006/0220631 | A1 | 10/2006 | Ito |
| 2006/0238182 | A1 | 10/2006 | Yoshino |

FOREIGN PATENT DOCUMENTS

| JP | 2003-235251 | 8/2003 |
| JP | 2006-34030 | 2/2006 |

* cited by examiner

*Primary Examiner*—Adolf Berhane
(74) *Attorney, Agent, or Firm*—Oblon, Spivak, McClelland, Maier & Neustadt, P.C.

(57) ABSTRACT

A semiconductor device having conversion units which change the reference potential of an input signal to a first or second reference potential and outputs the input signal to a first drive unit or second drive unit, change the reference potential of a first control signal output from the first drive unit to the second reference potential and outputs the first control signal to the second drive unit, and changes the reference potential of a second control signal output from the second drive unit to the first reference potential and outputs the second control signal to the first drive unit, wherein the conversion units increase currents flowing through the conversion units on the basis of a time when the input signal changes.

20 Claims, 7 Drawing Sheets

US 7,474,083 B2

SEMICONDUCTOR DEVICE

CROSS REFERENCE TO RELATED APPLICATIONS

This application is a continuation of U.S. application Ser. No. 11/513,120, filed Aug. 31, 2006, and is based upon and claims the benefit of priority under 35 USC 119 from the Japanese Patent Application No. 2005-258180, filed Sep. 6, 2005, the entire contents of each of which are incorporated herein by reference.

BACKGROUND OF THE INVENTION

There are DC-DC converters which generate a desired level of DC voltage by converting an externally input DC voltage into a high-frequency AC voltage and smoothing the AC voltage and output the DC voltage to a subsequent circuit. A plurality of DC-DC converters of this type are mounted in, e.g., an electronic device such as a cellular phone handset which uses a battery as its power source and generate a plurality of voltages for respective functional blocks.

In recent years, the operating frequencies of DC-DC converters have been increasing to cope with the lower voltage and higher current of a power source. For this reason, high-speed operation and high efficiency are required of a control circuit of a DC-DC converter. However, implementation of high-speed operation involves problems such as an increase in current consumption and an increase in circuit scale.

SUMMARY OF THE INVENTION

According to one aspect of the present invention, there is provided a semiconductor device including first and second switching elements connected in series between first and second terminals with a predetermined potential difference between the terminals, and a control unit which controls connection states of the first and second switching elements on the basis of an input signal such that when one of the first and second switching elements enters an off state, the other switching element enters an on state, wherein the control unit has a first drive unit to which a first reference potential is applied as a reference potential and which generates and outputs a first control signal for controlling the connection state of the first switching element on the basis of the input signal and a second control signal, a second drive unit to which a second reference potential different from the first reference potential is applied as a reference potential and which generates and outputs the second control signal for controlling the connection state of the second switching element on the basis of the input signal and the first control signal, and a conversion unit which changes a reference potential of the input signal to one of the first and second reference potentials and outputs the input signal to one of the first and second drive units, changes a reference potential of the first control signal output from the first drive unit to the second reference potential and outputs the first control signal to the second drive unit, and changes a reference potential of the second control signal output from the second drive unit to the first reference potential and outputs the second control signal to the first drive unit, and the conversion unit increases a current flowing through the conversion unit on the basis of a time when the input signal changes.

DETAILED DESCRIPTION OF THE INVENTION

Embodiments of the present invention will be explained below with reference to the drawings.

(1) First Embodiment

Figure 1:
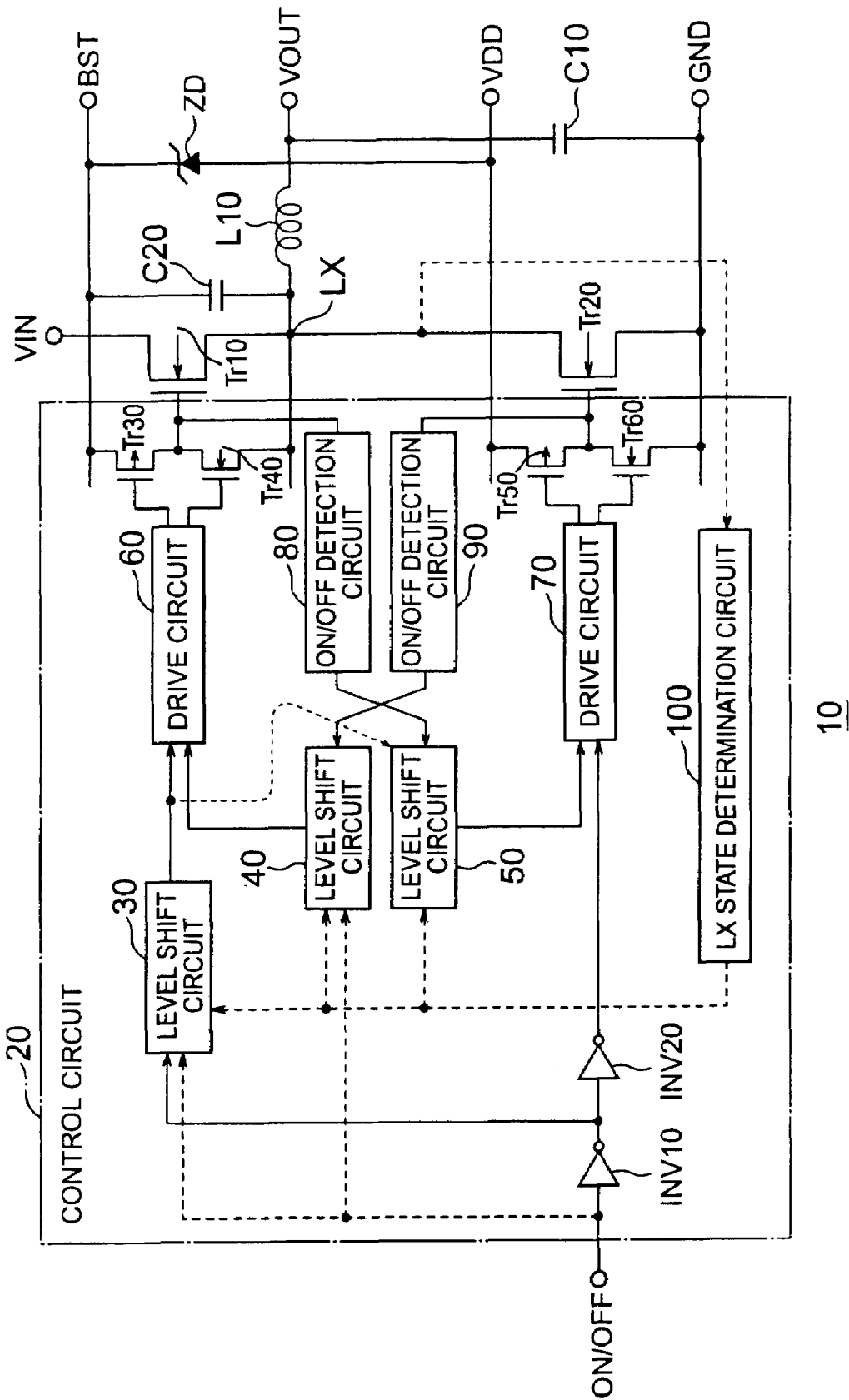
FIG. 1 is a block diagram showing the configuration of a DC-DC converter according to a first embodiment of the present invention.

FIG. 1 shows the configuration of a DC-DC converter 10 according to a first embodiment of the present invention. The DC-DC converter 10 generates a desired level of DC voltage by converting a DC voltage input from a voltage input terminal VIN into a high-frequency AC voltage and smoothing the AC voltage and outputs the DC voltage from a voltage output terminal VOUT.

The DC-DC converter 10 has NMOS transistors Tr10 and Tr20 as switching elements. A source of the NMOS transistor Tr10 and a drain of the NMOS transistor Tr20 are connected, a drain of the NMOS transistor Tr10 is connected to the voltage input terminal VIN, and a source of the NMOS transistor Tr20 is connected to a ground terminal GND.

The DC-DC converter 10 alternates the operation of turning on or off the NMOS transistors Tr10 and Tr20 with the reverse operation such that if an NMOS transistor Tr, one of the NMOS transistors Tr10 and Tr20 is brought into an off state, the other NMOS transistor Tr is brought into an on state. With this operation, an AC voltage is generated at a node LX which is the junction of the NMOS transistors Tr10 and Tr20.

More specifically, if the NMOS transistor Tr10 is brought into the on state, and the NMOS transistor Tr20 is brought into the off state, the node LX is connected to the voltage input terminal VIN. This changes the potential of the node LX to the same potential as that of the DC voltage applied from the voltage input terminal VIN.

On the other hand, if the NMOS transistor Tr10 is brought into the off state, and the NMOS transistor Tr20 is brought into the on state, the node LX is connected to the ground terminal GND. This changes the potential of the node LX to 0 V.

An AC voltage obtained in the above-described manner is smoothed by a low-pass filter composed of a coil L10 connected between the node LX and the voltage output terminal VOUT and a capacitor C10 connected between the voltage output terminal VOUT and the ground terminal GND. The AC voltage is outputted as a desired level of DC voltage from the voltage output terminal VOUT.

The voltage level of the DC voltage is determined on the basis of the ratio (i.e., an on/off time ratio) between a period of time (i.e., an on time) during which the NMOS transistor Tr10 is in the on state, and the DC voltage applied from the voltage input terminal VIN is selected as a potential to be generated at the node LX and a period of time (i.e., an off time) during which the NMOS transistor Tr20 is in the on state, and 0 V is selected as the potential to be generated at the node LX.

For this reason, the DC-DC converter 10 has a control circuit 20 which controls on/off operation for the NMOS transistors Tr10 and Tr20 in accordance with an on/off control signal for controlling the on/off time ratio supplied from a control signal input terminal ON/OFF.

To prevent the NMOS transistors Tr10 and Tr20 from simultaneously entering the on state, the control circuit 20 first brings one of the NMOS transistors, the NMOS transistor Tr10 or Tr20 into the off state in accordance with the on/off control signal. The control circuit 20 notifies a drive circuit 70 or 60 for driving the other NMOS transistor Tr20 or Tr10 that the one NMOS transistor Tr10 or Tr20 has changed to the off state, thereby bringing the other NMOS transistor Tr20 or Tr10 into the on state. The control circuit 20 notifies the drive circuit 60 or 70 for driving the NMOS transistor Tr10 or Tr20 that the other NMOS transistor Tr20 or Tr10 has changed to the on state.

As described above, the control circuit 20 notifies one of the NMOS transistors Tr10 and Tr20 of the connection state of the other and notifies the other of the connection state of the one. With this operation, the control circuit 20 controls the on/off operation for the NMOS transistors Tr10 and Tr20 such that if one of the NMOS transistors, the NMOS transistor Tr10 or Tr20 is brought into the off state, the other NMOS transistor Tr20 or Tr10 is brought into the on state.

Of the NMOS transistors Tr10 and Tr20, the NMOS transistor Tr20 uses, as its reference potential, a potential applied from the ground terminal GND, i.e., 0 V while the NMOS transistor Tr10 uses, as its reference potential, a potential generated at the node LX.

The control circuit 20 has a PMOS transistor Tr50 and an NMOS transistor Tr60 as circuits for driving the NMOS transistor Tr20. A drain of the PMOS transistor Tr50 and a drain of the NMOS transistor Tr60 are connected, and the junction of the transistors is connected to a gate of the NMOS transistor Tr20. A source of the PMOS transistor Tr50 is connected to a power supply terminal VDD, and a source of the NMOS transistor Tr60 is connected to the ground terminal GND. For this reason, the PMOS transistor Tr50 and NMOS transistor Tr60 use 0 V as their reference potentials.

The control circuit 20 also has a PMOS transistor Tr30 and an NMOS transistor Tr40 as circuits for driving the NMOS transistor Tr10. A drain of the PMOS transistor Tr30 and a drain of the NMOS transistor Tr40 are connected, and the junction of the transistors is connected to a gate of the NMOS transistor Tr10. A source of the PMOS transistor Tr30 is connected to a terminal BST, and a source of the NMOS transistor Tr40 is connected to the node LX. For this reason, the PMOS transistor Tr30 and NMOS transistor Tr40 use the potential generated at the node LX as their reference potentials.

Note that a zener diode ZD is connected between the terminal BST and the power supply terminal VDD. A cathode of the zener diode ZD is connected to the terminal BST while an anode thereof is connected to the power supply terminal VDD. A capacitor C20 is connected between the terminal BST and the node LX.

The zener diode ZD and capacitor C20 form a constant voltage circuit. For this reason, the potential of the terminal BST changes in response to a change in the potential of the node LX such that the potential difference between the terminal BST and the node LX is kept constant.

As described above, in the control circuit 20, the circuits for driving the NMOS transistor Tr20 use, as their reference potentials, 0 V, i.e., a low reference potential while the circuits for driving the NMOS transistor Tr10 use, as their reference potentials, the potential generated at the node LX, i.e., a high reference potential.

Accordingly, when transferring a signal with the low reference potential to the drive circuit 60 on the high reference potential side, the control circuit 20 needs to convert the signal with the low reference potential into one with the high reference potential (change the reference potential from the low reference potential to the high reference potential) and transfer the resulting signal to the drive circuit 60 on the high reference potential side.

When transferring a signal with the high reference potential to the drive circuit 70 on the low reference potential side, the control circuit 20 needs to convert the signal with the high reference potential into one with the low reference potential (change the reference potential from the high reference potential to the low reference potential) and transfer the resulting signal to the drive circuit 70 on the low reference potential side.

For this reason, the control circuit 20 has level shift circuits 30 and 40 for converting a signal with the low reference potential into one with the high reference potential used to transfer a signal with the low reference potential to the drive circuit 60 on the high reference potential side and a level shift circuit 50 for converting a signal with the high reference potential into one with the low reference potential used to transfer a signal with the high reference potential to the drive circuit 70 on the low reference potential side.

When a signal of "L" level is input from the control signal input terminal ON/OFF as the on/off control signal with the low reference potential, the control circuit 20 inverts the level of the signal with an inverter INV10 and outputs the obtained signal of "H" level to the level shift circuit 30 on the high reference potential side. At the same time, the control circuit 20 further inverts the level of the signal from "H" level to "L" level with an inverter INV20 and outputs the obtained signal of "L" level to the drive circuit 70 on the low reference potential side.

The level shift circuit 30 converts the signal of "H" level with the low reference potential into one of "H" level with the high reference potential and outputs the resulting signal to the drive circuit 60. If at least one of two input signals is at "H" level, the drive circuit 60 outputs a signal of "H" level to both the PMOS transistor Tr30 and NMOS transistor Tr40. On the other hand, if both the input signals are at "L" level, the drive circuit 60 outputs a signal of "L" level to both the PMOS transistor Tr30 and NMOS transistor Tr40.

In this example, the drive circuit 60 outputs a signal of "H" level to both the PMOS transistor Tr30 and NMOS transistor Tr40 to bring the PMOS transistor Tr30 into the off state and the NMOS transistor Tr40 into the on state.

This causes the gate of the NMOS transistor Tr10 to be connected to the node LX via the NMOS transistor Tr40, and as a result, the NMOS transistor Tr10 is brought into the off state.

An on/off detection circuit 80 is a circuit for detecting whether the NMOS transistor Tr10 is in the on state or off state. When the on/off detection circuit 80 detects that the NMOS transistor Tr10 has changed to the off state, it outputs a signal of "L" level with the high reference potential to the level shift circuit 50.

The level shift circuit 50 converts the signal of "L" level with the high reference potential into one of "L" level with the low reference potential and outputs the resulting signal to the drive circuit 70. When the signal of "L" level is supplied from the inverter INV20, and the signal of "L" level is supplied from the level shift circuit 50, the drive circuit 70 outputs a signal of "L" level to both the PMOS transistor Tr50 and NMOS transistor Tr60 to bring the PMOS transistor Tr50 into the on state and the NMOS transistor Tr60 into the off state.

This causes the gate of the NMOS transistor Tr20 to be connected to the power supply terminal VDD via the PMOS transistor Tr50, and as a result, the NMOS transistor Tr20 is brought into the on state.

When an on/off detection circuit 90 detects that the NMOS transistor Tr20 has changed to the on state, it outputs a signal of "H" level with the low reference potential to the level shift circuit 40. After the level shift circuit 40 converts the signal into one of "H" level with the high reference potential, it outputs the resulting signal to the drive circuit 60.

In this case, since the drive circuit 60 continues to output the signal of "H" level to both the PMOS transistor Tr30 and NMOS transistor Tr40, the NMOS transistor Tr10 remains in the off state.

After that, when the on/off control signal changes from "L" level to "H" level, the control circuit 20 inverts the level of the signal with the inverter INV10, converts the obtained signal of "L" level into one of "L" level with the high reference potential in the level shift circuit 30, and outputs the resulting signal to the drive circuit 60. At the same time, the control circuit 20 further inverts the level of the signal with the inverter INV20 and outputs the obtained signal of "H" level to the drive circuit 70.

In this case, the drive circuit 70 outputs a signal of "H" level to both the PMOS transistor Tr50 and NMOS transistor Tr60 to bring the PMOS transistor Tr50 into the off state and the NMOS transistor Tr60 into the on state.

This causes the gate of the NMOS transistor Tr20 to be connected to the ground terminal GND via the NMOS transistor Tr60, and as a result, the NMOS transistor Tr20 is brought into the off state.

When the on/off detection circuit 90 detects that the NMOS transistor Tr20 has changed to the off state, it outputs a signal of "L" level with the low reference potential to the level shift circuit 40. After the level shift circuit 40 converts the signal into one of "L" level with the high reference potential, it outputs the resulting signal to the drive circuit 60.

When the signal of "L" level is supplied from the level shift circuit 30, and the signal of "L" level is supplied from the level shift circuit 40, the drive circuit 60 outputs a signal of "L" level to both the PMOS transistor Tr30 and NMOS transistor Tr40 to bring the PMOS transistor Tr30 into the on state and the NMOS transistor Tr40 into the off state.

This causes the gate of the NMOS transistor Tr10 to be connected to the terminal BST via the PMOS transistor Tr30, and as a result, the NMOS transistor Tr10 is brought into the on state.

When the on/off detection circuit 80 detects that the NMOS transistor Tr10 has changed to the on state, it outputs a signal of "H" level with the high reference potential to the level shift circuit 50. After the level shift circuit 50 converts the signal into one of "H" level with the low reference potential, it outputs the resulting signal to the drive circuit 70.

In this case, since the drive circuit 70 continues to output the signal of "H" level to both the PMOS transistor Tr50 and NMOS transistor Tr60, the NMOS transistor Tr20 remains in the off state.

In this embodiment, the control circuit 20 inputs the on/off control signal with the low reference potential, having been supplied from the control signal input terminal ON/OFF, to the level shift circuits 30 and 40. Since the control circuit 20 needs to input the on/off control signal to the level shift circuit 50 after converting the signal into one with the high reference potential, it inputs, to the level shift circuit 50, a signal output from the level shift circuit 30. The control circuit 20 also has an LX state determination circuit 100. The LX state determination circuit 100 determines the state, i.e., potential of the node LX and outputs the determination result as a LX state determination signal to the level shift circuits 30 to 50.

To implement high-speed operation and high efficiency, the control circuit 20 needs to shorten time (i.e., dead time) from when one of the NMOS transistors Tr10 and Tr20 is brought into the off state to when the other NMOS transistor Tr20 or Tr10 is brought into the on state.

For this reason, the level shift circuits 30 to 50 are required to transfer signals at high speed. The signal transfer speeds of the level shift circuits 30 to 50 depend on respective driving currents in the level shift circuits 30 to 50.

Accordingly, each of the level shift circuits 30 to 50 is configured to increase the signal transfer speed by increasing a driving current therein on the basis of a time when the on/off control signal changes.

In this case, each of the level shift circuits 30 to 50 needs to set a driving current increase time such that the driving current increases at least until the potential of the node LX changes. The level shift circuit 30 to 50 decreases the increased driving current after the potential of the node LX changes, on the basis of the LX state determination signal supplied from the LX state determination circuit 100.

Figure 2:
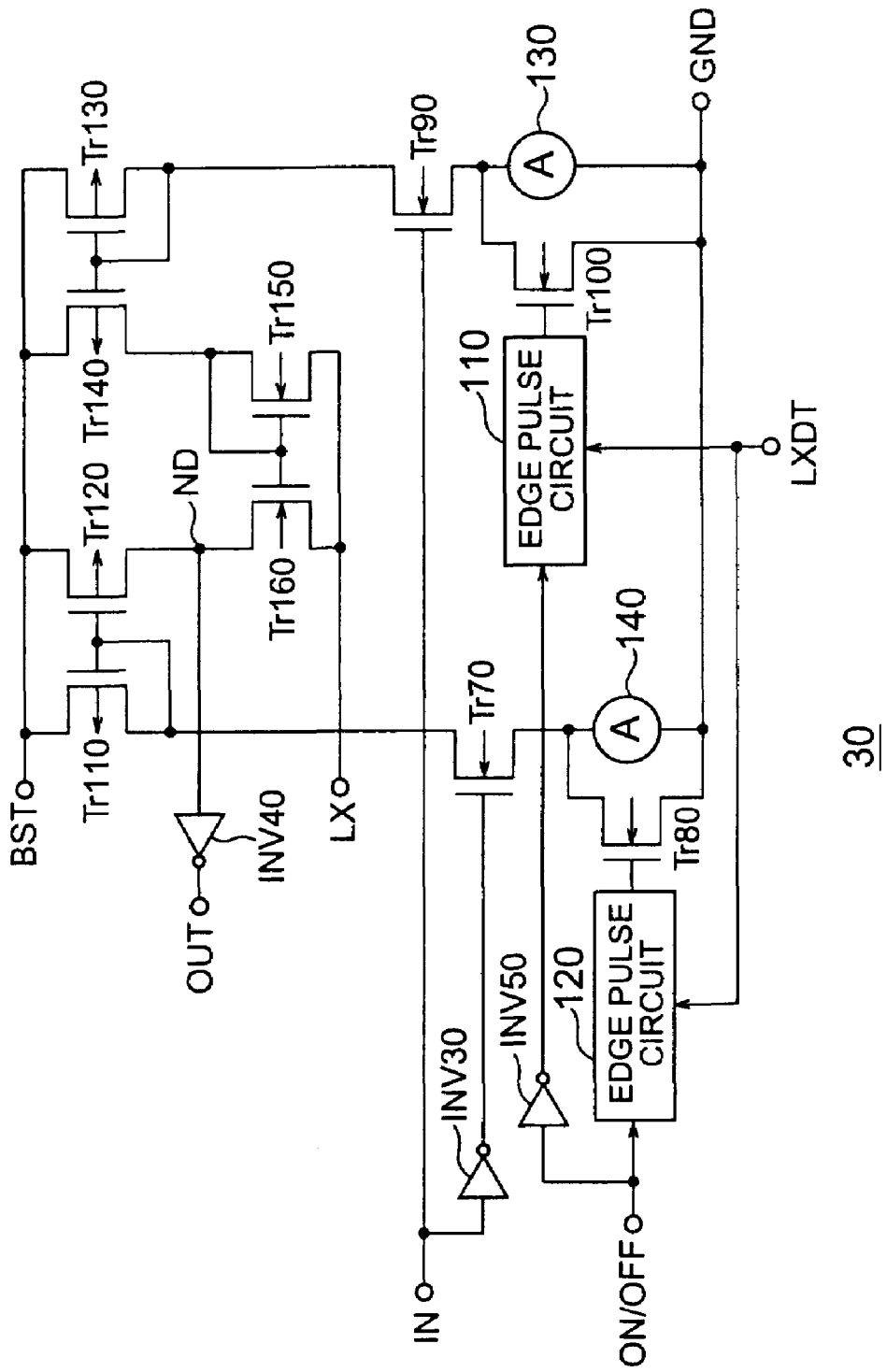
FIG. 2 is a block diagram showing the configuration of a level shift circuit.
Figure 3:
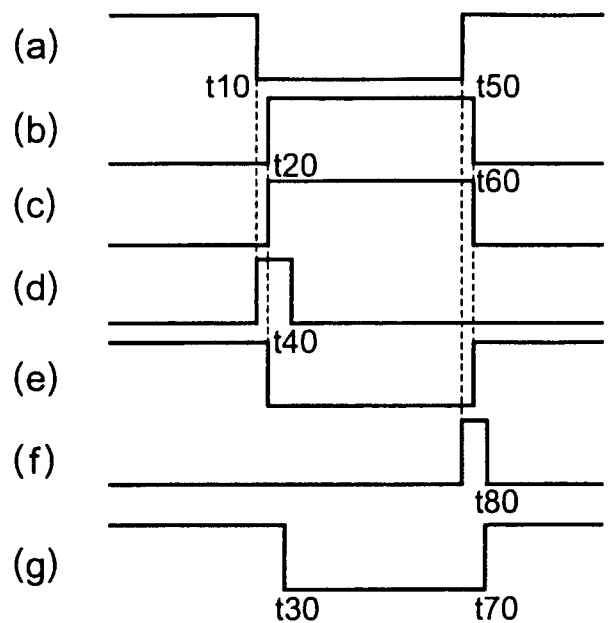
FIG. 3 is a timing chart in the level shift circuit.

FIG. 2 shows the configuration of the level shift circuit 30, which converts a signal with the low reference potential into one with the high reference potential. FIG. 3 shows an example of a timing chart in the level shift circuit 30. An input terminal IN is connected to a gate of an NMOS transistor Tr90 and also connected to a gate of an NMOS transistor Tr70 via an inverter INV30.

A source of the NMOS transistor Tr90 is connected to the ground terminal GND via a constant current source 130. A drain of an NMOS transistor Tr100 is connected to the junction of the source of the NMOS transistor Tr90 and the constant current source 130, and the ground terminal GND is connected to a source of the NMOS transistor Tr100.

An edge pulse circuit 110 is connected to a gate of the NMOS transistor Tr100. The on/off control signal input from the control signal input terminal ON/OFF via an inverter INV50 and the LX state determination signal input from the LX state determination circuit 100 via a determination input terminal LXDT are input to the edge pulse circuit 110.

A source of the NMOS transistor Tr70 is connected to the ground terminal GND via a constant current source 140. A drain of the NMOS transistor Tr80 is connected to the junction of the source of the NMOS transistor Tr70 and the constant current source 140, and the ground terminal GND is connected to a source of the NMOS transistor Tr80.

An edge pulse circuit 120 is connected to a gate of the NMOS transistor Tr80. The on/off control signal input from the control signal input terminal ON/OFF and the LX state determination signal input from the LX state determination circuit 100 via the determination input terminal LXDT are input to the edge pulse circuit 120.

A drain of a PMOS transistor Tr130 is connected to a drain of the NMOS transistor Tr90. The terminal BST is connected to sources of the PMOS transistor Tr130 and a PMOS transistor Tr140. Gates of the PMOS transistors Tr130 and Tr140 are connected to each other, and the drain of the PMOS transistor Tr130 is connected to the junction of the gates. For this reason, the PMOS transistors Tr130 and Tr140 form a current mirror circuit.

A drain of a PMOS transistor Tr110 is connected to a drain of the NMOS transistor Tr70. The terminal BST is connected to sources of the PMOS transistor Tr110 and a PMOS transistor Tr120. Gates of the PMOS transistors Tr110 and Tr120 are connected to each other, and the drain of the PMOS transistor Tr110 is connected to the junction of the gates. For this reason, the PMOS transistors Tr110 and Tr120 form a current mirror circuit.

A drain of an NMOS transistor Tr150 is connected to a drain of the PMOS transistor Tr140, and a drain of an NMOS transistor Tr160 is connected to a drain of the PMOS transistor Tr120. Sources of the NMOS transistors Tr150 and Tr160 are connected to the node LX via a terminal LX. An output terminal OUT is connected to the junction of the PMOS transistor Tr120 and the NMOS transistor Tr160 via an inverter INV40.

Gates of the NMOS transistors Tr150 and Tr160 are connected to each other, and the drain of the NMOS transistor Tr150 is connected to the junction of the gates. For this reason, the NMOS transistors Tr150 and Tr160 form a current mirror circuit.

When an input signal (FIG. 3(b)) with the low reference potential input from the input terminal IN changes from "L" level to "H" level (time t20), the NMOS transistor Tr70 enters the off state (FIG. 3(e)), and the NMOS transistor Tr90 enters the on state (FIG. 3(c)).

In this case, since the NMOS transistor Tr70 enters the off state, no current flows through the PMOS transistor Tr110. Due to the characteristics of the current mirror circuit, no current flows through the PMOS transistor Tr120 as well.

In the meantime, since the NMOS transistor Tr90 enters the on state, a current equal to one which flows through the NMOS transistor Tr90 flows through the PMOS transistor Tr130. Due to the characteristics of the current mirror circuit, a current equal to that which flows through the NMOS transistor Tr90 flows through the PMOS transistor Tr140 as well. Additionally, a current equal to that which flows through the NMOS transistor Tr90 flows through the NMOS transistor Tr150.

Due to the characteristics of the current mirror circuit, there arises a force trying to feed, to the NMOS transistor Tr160, a current equal to that for the NMOS transistor Tr90. However, since the PMOS transistor Tr120 is in the off state, no current flows through the NMOS transistor Tr160.

For this reason, the potential difference between the drain and source of the NMOS transistor Tr160 becomes almost 0 V, and as a result, the potential of a node ND changes to the same potential as that of the node LX applied from the terminal LX, i.e., a signal of "L" level with the high reference potential. The inverter INV40 inverts the level of a signal of "L" level with the high reference potential and outputs the obtained signal of "H" level with the high reference potential from the output terminal OUT.

In this embodiment, at a time when the on/off control signal (FIG. 3(a)) changes from "H" level to "L" level (time t10), the edge pulse circuit 110 outputs a signal of "H" level to the gate of the NMOS transistor Tr100 (FIG. 3(d)) to bring the NMOS transistor Tr100 into the on state.

As a result, a current which is the sum of a current which flows through the constant current source 130 and one which flows through the NMOS transistor Tr100 flows through the NMOS transistor Tr90. The large increase in the current, which flows through the NMOS transistor Tr90, i.e., a driving current makes it possible to increase the signal transfer speed. The increase in the driving current before the input signal input from the input terminal IN changes from "L" level to "H" level makes it possible to improve the stability of the operation of the level shift circuit 30.

After that, if the potential of the node LX changes from the same potential as that of the DC voltage input from the voltage input terminal VIN to 0 V, and the LX state determination signal (FIG. 3(g)) changes from "H" level to "L" level (time t30), the edge pulse circuit 110 outputs a signal of "L" level to the gate of the NMOS transistor Tr100 (FIG. 3(d)) to bring the NMOS transistor Tr100 into the off state (time t40).

As a result, a current equal to that which flows through the constant current source 130 flows through the NMOS transistor Tr90. The current, which flows through the NMOS transistor Tr90, decreases to a level just enough to maintain the output state of the output terminal OUT.

The decrease in the increased driving current on the basis of the time when the potential of the node LX changes makes it possible to suppress the driving current increase time to the minimum necessary and thus implement a decrease in current consumption. The decrease also has the effect of eliminating the need to provide, in the edge pulse circuit 110, a CR circuit for setting the driving current increase time. This makes it possible to implement a decrease in circuit scale.

When the input signal (FIG. 3(b)) with the low reference potential input from the input terminal IN changes from "H" level to "L" level (time t60), the NMOS transistor Tr70 enters the on state (FIG. 3(e)), and the NMOS transistor Tr90 enters the off state (FIG. 3(c)).

In this case, since the NMOS transistor Tr90 enters the off state, no current flows through the PMOS transistor Tr130. Due to the characteristics of the current mirror circuit, no current flows through the PMOS transistor Tr140 as well. For this reason, no current flows through the NMOS transistor Tr150. Due to the characteristics of the current mirror circuit, no current flows through the NMOS transistor Tr160 as well.

In the meantime, since the NMOS transistor Tr70 enters the on state, a current equal to one which flows through the NMOS transistor Tr70 flows through the PMOS transistor Tr110. Due to the characteristics of the current mirror circuit, there arises a force trying to feed, to the PMOS transistor Tr120, a current equal to that for the NMOS transistor Tr70. However, since the NMOS transistor Tr160 is in the off state, no current flows through the PMOS transistor Tr120.

For this reason, the potential difference between the drain and source of the PMOS transistor Tr120 becomes almost 0 V, and as a result, the potential of the node ND changes to the same potential as that applied from the terminal BST, i.e., the high reference potential ("H" level). The inverter INV40 inverts the level of a signal of "H" level with the high reference potential and outputs the obtained signal of "L" level with the high reference potential from the output terminal OUT.

As in the above-described case, at a time when the on/off control signal (FIG. 3(a)) changes from "L" level to "H" level (time t50), the edge pulse circuit 120 outputs a signal of "H" level to the gate of the NMOS transistor Tr80 (FIG. 3(f)) to bring the NMOS transistor Tr80 into the on state.

As a result, a current which is the sum of a current which flows through the constant current source 140 and one which flows through the NMOS transistor Tr80 flows through the NMOS transistor Tr70. This largely increases the current, which flows through the NMOS transistor Tr70, i.e., the driving current.

After that, if the potential of the node LX changes from 0 V to the same potential as that of the DC voltage input from the voltage input terminal VIN, and the LX state determination signal (FIG. 3(g)) changes from "L" level to "H" level (time t70), the edge pulse circuit 120 outputs a signal of "L" level to the gate of the NMOS transistor Tr80 (FIG. 3(f)) to bring the NMOS transistor Tr80 into the off state.

As a result, a current equal to that which flows through the constant current source 140 flows through the NMOS transistor Tr70. The current, which flows through the NMOS transistor Tr70, decreases to a level just enough to maintain the output state of the output terminal OUT.

Figure 4:
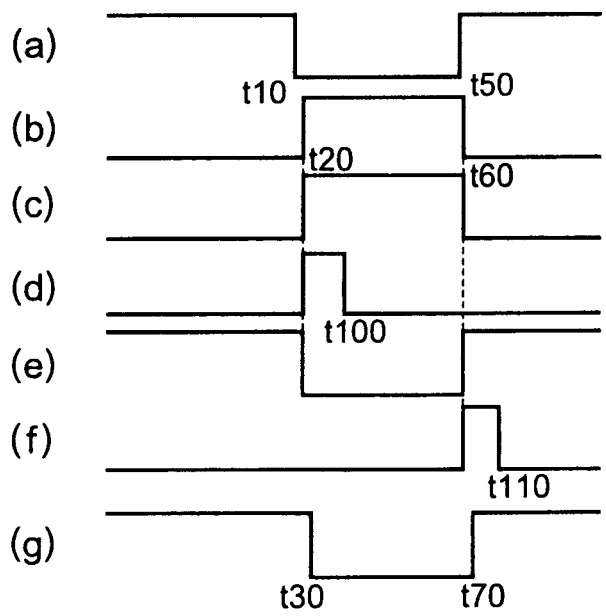
FIG. 4 is a timing chart in a level shift circuit of a comparative example.

FIG. 4 shows, as a comparative example, an example of a timing chart in the case (FIGS. 4(d) and 4(f)) of increasing the driving current from a time (time t20 or t60) when a signal input to the level shift circuit (FIG. 4(b)) changes to a time (time t100 or t110) set by a time constant CR for a CR circuit of the edge pulse circuit.

In this comparative example, the driving current increase time needs to be set to be longer such that it includes time to spare, in consideration of variations in switching time among the NMOS transistors Tr10 and Tr20 and the like and variations in CR elements. Such prolongation of the driving current increase time causes an increase in current consumption and thus creates the need to provide a CR circuit with a large time constant CR. This causes a problem of an increase in circuit scale.

Note that the level shift circuit 40 has the same configuration as the level shift circuit 30. However, when the level shift circuit 40 notifies the drive circuit 60 that the NMOS transistor Tr20 has changed to the on state, the NMOS transistor Tr10 remains in the off state, and the potential of the node LX does not change. Accordingly, in this case, a time when an increased driving current is decreased is set by a time constant CR for a CR circuit of an edge pulse circuit having increased the driving current.

Figure 5:
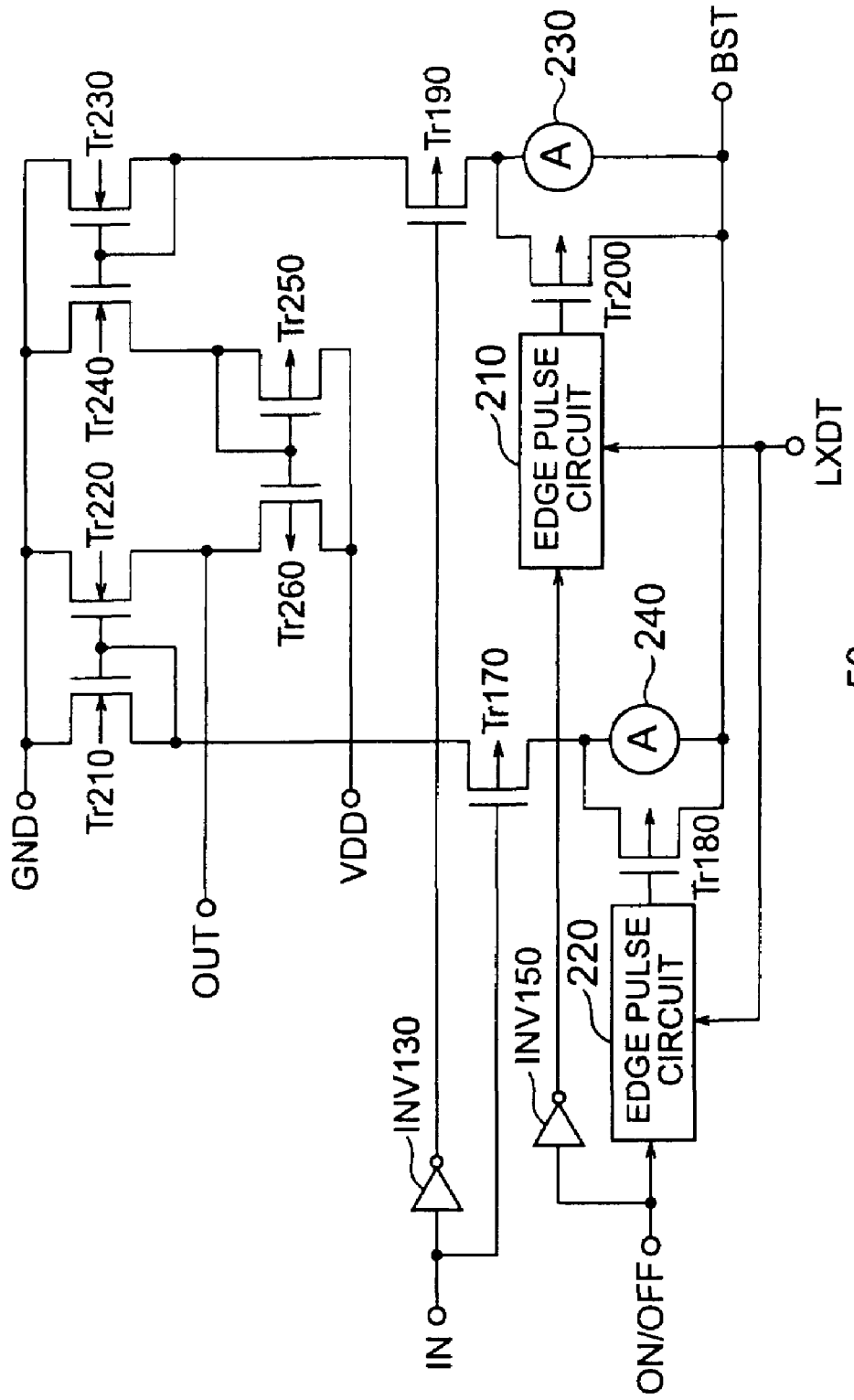
FIG. 5 is a block diagram showing the configuration of a level shift circuit.

FIG. 5 shows the configuration of the level shift circuit 50, which converts a signal with the high reference potential into one with the low reference potential. The level shift circuit 50 is formed by reversing the plus and minus signs of circuit elements included in the level shift circuit 30 (FIG. 2) except for an inverter INV150 provided at the preceding stage of an edge pulse circuit 210.

More specifically, the level shift circuit 50 has an inverter INV130 and the inverter INV150, the edge pulse circuit 210 and an edge pulse circuit 220, constant current sources 230 and 240, PMOS transistors Tr170 to TR200, NMOS transistors Tr210 and Tr220, NMOS transistors Tr230 and Tr240, and PMOS transistors Tr250 and Tr260. Each of the pair of NMOS transistors, Tr210 and Tr220, the pair of NMOS transistors, Tr230 and Tr240, and the pair of PMOS transistors, Tr250 and Tr260 form a current mirror circuit.

Note that similarly to the level shift circuit 40, when the level shift circuit 50 notifies the drive circuit 70 that the NMOS transistor Tr10 has changed to the on state, the NMOS transistor Tr20 remains in the off state, and the potential of the node LX does not change. Accordingly, in this case, a time when an increased driving current is decreased is set by a time constant CR for a CR circuit of an edge pulse circuit having increased the driving current.

As described above, according to this embodiment, it is possible to implement high-speed operation and at the same time implement a decrease in current consumption and circuit scale.

(2) Second Embodiment

Figure 6:
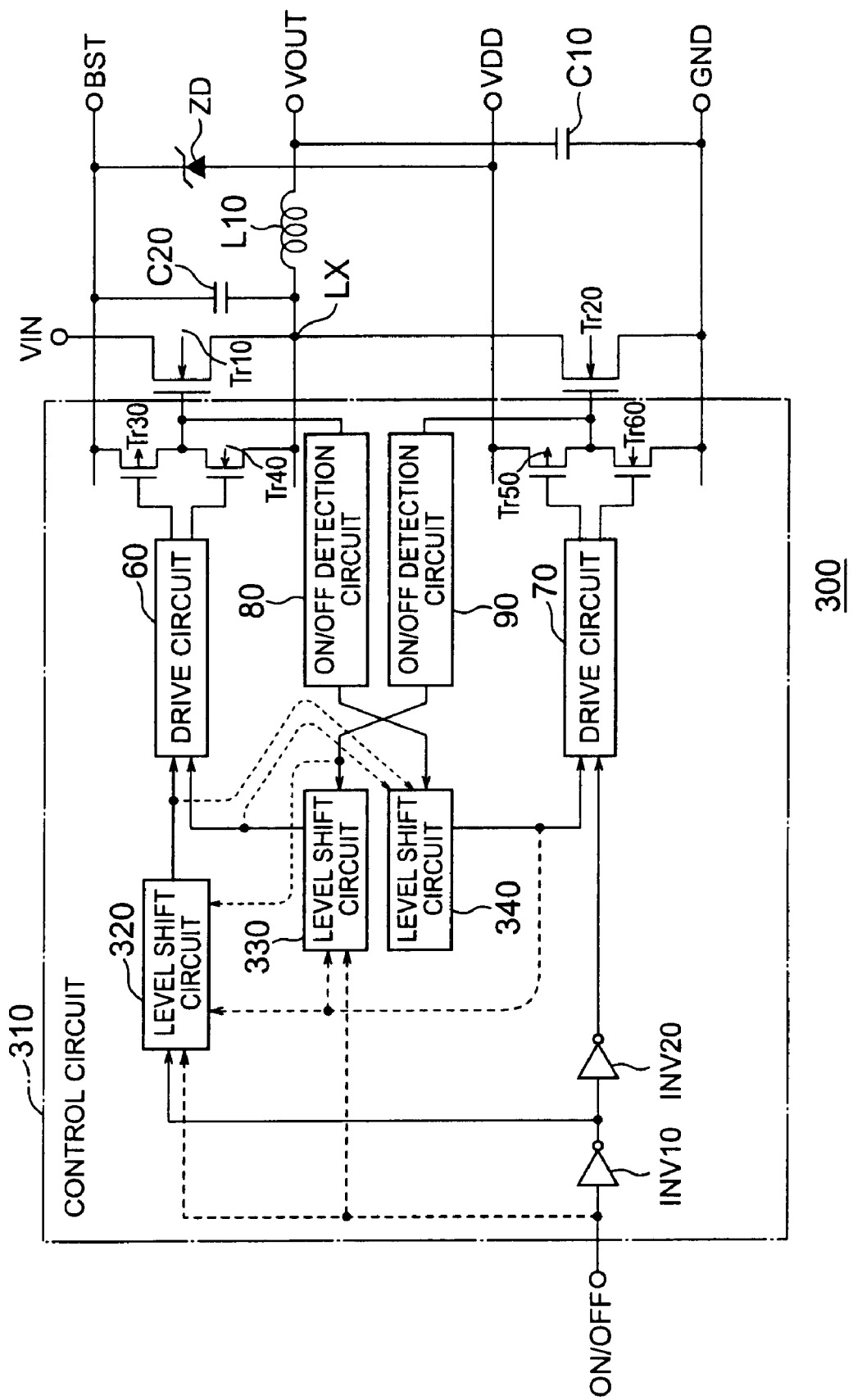
FIG. 6 is a block diagram showing the configuration of a DC-DC converter according to a second embodiment of the present invention.

FIG. 6 shows the configuration of a DC-DC converter 300 according to a second embodiment of the present invention. Note that the same components as those shown in FIG. 1 are denoted by the same reference numerals and that an explanation thereof will be omitted. Level shift circuits 320 to 340 have the same configurations as the corresponding level shift circuits 30 to 50 (FIGS. 2 and 5) except for edge pulse circuits.

The potential of a node LX changes in response to a change in signals indicating the connection states of NMOS transistors Tr10 and Tr20 output from on/off detection circuits 80 and 90. Accordingly, in this embodiment, each of the level shift circuits 320 to 340 determines a time when an increased driving current is decreased using a signal notifying, of the connection state of one of the NMOS transistors Tr10 and Tr20, a drive circuit 70 or 60 for driving the other NMOS transistor Tr20 or Tr10, i.e., a signal output from the on/off detection circuit 80 or 90.

The level shift circuit 320 inputs a signal output from the on/off detection circuit 90 to an edge pulse circuit (one corresponding to the edge pulse circuit 110 of the level shift circuit 30 in FIG. 2) used to transfer an on/off control signal of "L" level (one for bringing the NMOS transistor Tr10 into an off state).

The edge pulse circuit increases a driving current at a time when the on/off control signal changes from "H" level to "L" level. After that, when the NMOS transistor Tr20 changes to an on state, and the potential of the node LX changes to 0V, the signal output from the on/off detection circuit 90 changes from "L" level to "H" level. The edge pulse circuit decreases the driving current on the basis of the time when the signal changes to "H" level.

The level shift circuit 320 inputs a signal output from the on/off detection circuit 80 after converting the signal into one with a low reference potential in the level shift circuit 340 to an edge pulse circuit (one corresponding to the edge pulse circuit 120 of the level shift circuit 30 in FIG. 2) used to transfer the on/off control signal of "H" level (one for bringing the NMOS transistor Tr10 into the on state).

The edge pulse circuit increases a driving current at a time when the on/off control signal changes from "L" level to "H" level. After that, when the NMOS transistor Tr10 changes to the on state, and the potential of the node LX changes to the same potential as that of a DC voltage applied from a voltage input terminal VIN, the signal output from the on/off detection circuit 80 via the level shift circuit 340 changes from "L" level to "H" level. The edge pulse circuit decreases the driving current on the basis of the time when the signal changes to "H" level.

The level shift circuit 330 inputs the signal output from the on/off detection circuit 80 after converting the signal into one with the low reference potential in the level shift circuit 340 to an edge pulse circuit (one corresponding to the edge pulse circuit 120 of the level shift circuit 20 in FIG. 2) used to make a notification that the NMOS transistor Tr20 has changed to the off state.

The edge pulse circuit increases a driving current at a time when the on/off control signal changes from "L" level to "H" level. After that, when the NMOS transistor Tr10 changes to the on state, and the potential of the node LX changes to the same potential as that of the DC voltage input from the voltage input terminal VIN, the signal output from the on/off detection circuit 80 via the level shift circuit 340 changes from "L" level to "H" level. The edge pulse circuit decreases the driving current on the basis of the time when the signal changes to "H" level.

Note that when the level shift circuit 330 notifies the drive circuit 60 that the NMOS transistor Tr20 has changed to the on state, the NMOS transistor Tr10 remains in the off state, and the potential of the node LX does not change. Accordingly, in this case, a time when the increased driving current is decreased is set by a time constant CR for a CR circuit of an edge pulse circuit (one corresponding to the edge pulse circuit 110 of the level shift circuit 20 in FIG. 2) used to make a notification that the NMOS transistor Tr20 has changed to the on state.

The level shift circuit 340 inputs the signal output from the on/off detection circuit 90 after converting the signal into one with a high reference potential in the level shift circuit 330 to an edge pulse circuit (one corresponding to the edge pulse circuit 210 of the level shift circuit 50 in FIG. 5) used to make a notification that the NMOS transistor Tr10 has changed to the off state.

The edge pulse circuit increases a driving current at a time when the on/off control signal changes from "H" level to "L" level. After that, when the NMOS transistor Tr20 changes to the on state, and the potential of the node LX changes to 0 V, the signal output from the on/off detection circuit 90 via the level shift circuit 330 changes from "L" level to "H" level. The edge pulse circuit decreases the driving current on the basis of the time when the signal changes to "H" level.

Note that when the level shift circuit 340 notifies the drive circuit 70 that the NMOS transistor Tr10 has changed to the on state, the NMOS transistor Tr20 remains in the off state, and the potential of the node LX does not change. Accordingly, in this case, a time when the increased driving current is decreased is set by a time constant CR for a CR circuit of an edge pulse circuit (one corresponding to the edge pulse circuit 220 of the level shift circuit 50 in FIG. 5) used to make a notification that the NMOS transistor Tr10 has changed to the on state.

As described above, according to this embodiment, it is possible to increase signal transfer speed and at the same time implement a decrease in current consumption and circuit scale. Also, this embodiment eliminates the need to provide the LX state determination circuit 100 (FIG. 1) and makes it possible to decrease CR circuits in the edge pulse circuits of the level shift circuits 320 to 340.

(3) Third Embodiment

Figure 7:
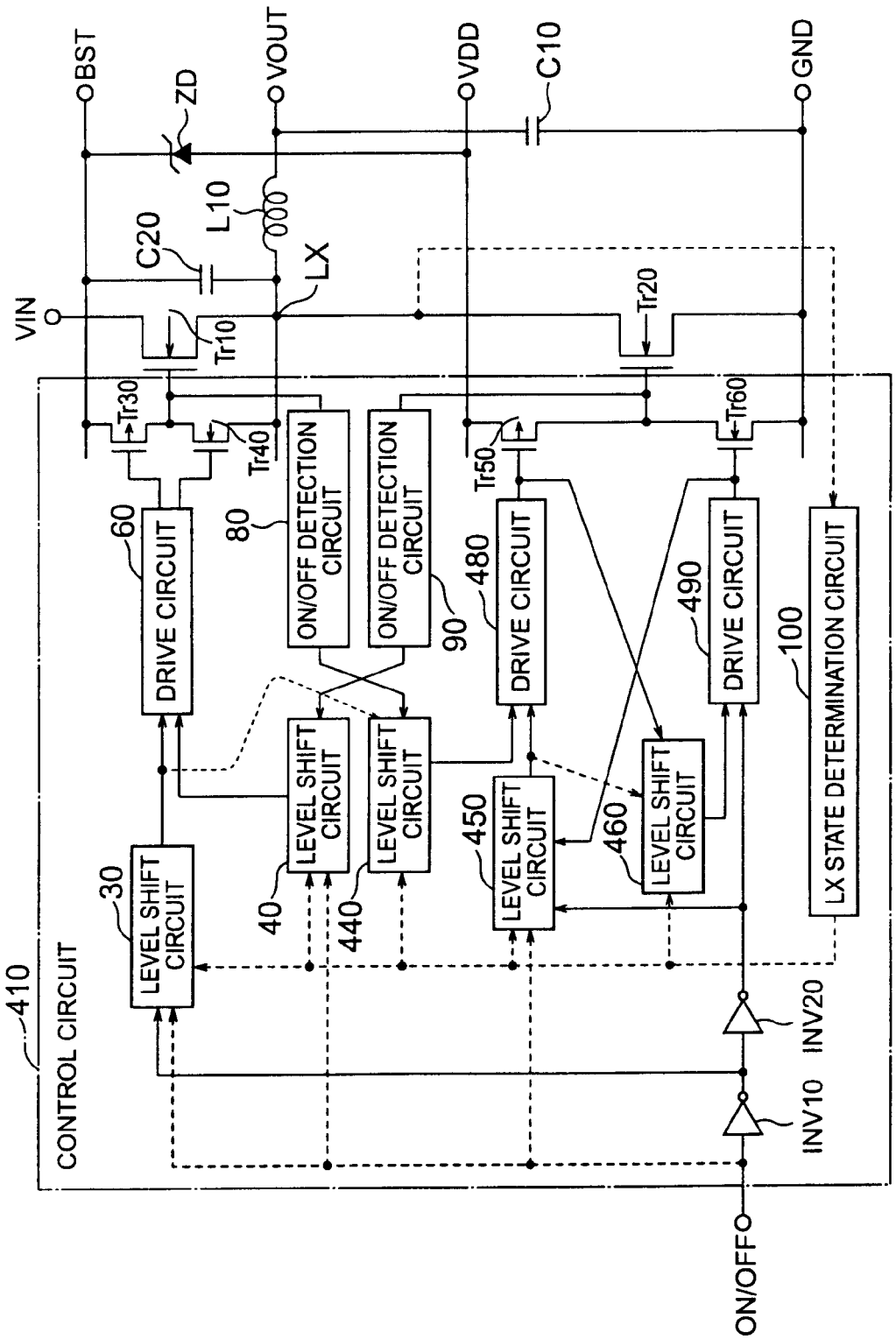
FIG. 7 is a block diagram showing the configuration of a DC-DC converter according to a third embodiment of the present invention.

FIG. 7 shows the configuration of a DC-DC converter 400 according to a third embodiment of the present invention. Note that the same components as those shown in FIG. 1 are denoted by the same reference numerals and that an explanation thereof will be omitted.

In this embodiment, a control circuit 410 has a drive circuit 480 for driving a PMOS transistor Tr50 and a drive circuit 490 for driving an NMOS transistor Tr60.

The drive circuits 480 and 490 are powered by different power sources. The drive circuit 490 uses, as a reference potential, 0 V, i.e., a low reference potential while the drive circuit 480 uses, as a reference potential, a potential between one applied from a power supply terminal VDD and 0 V (to be referred to as an intermediate reference potential hereinafter).

This makes it possible to increase the gate threshold voltage of an NMOS transistor Tr20 while maintaining the withstand voltages of the drive circuits 480 and 490. Accordingly, it is possible to decrease the on-resistance of the NMOS transistor Tr20 (a resistance generated between the source and drain when the NMOS transistor Tr20 is brought into an on state).

The control circuit 410 has a level shift circuit 450 for converting a signal with the low reference potential into one with the intermediate reference potential used to transfer a signal with the low reference potential to the drive circuit 480 on the intermediate reference potential side, and a level shift circuit 460 for converting a signal with the intermediate reference potential into one with the low reference potential used to transfer a signal with the intermediate reference potential to the drive circuit 490 on the low reference potential side.

Note that the level shift circuit 450 is formed by connecting the inverter INV50 connected at the preceding stage of the edge pulse circuit 110 in the level shift circuit 30 (FIG. 2) to the preceding stage of the edge pulse circuit 120 and that the level shift circuit 460 has the same configuration as the level shift circuit 50 (FIG. 5).

When a signal of "L" level is input from a control signal input terminal ON/OFF as an on/off control signal with the low reference potential, the control circuit 410 sequentially inverts the level of the signal with inverters INV10 and INV20. The control circuit 410 inputs the obtained signal of "L" level to the drive circuit 490 on the low reference potential side and the level shift circuit 450. The level shift circuit 450 converts the signal of "L" level with the low reference potential into one of "L" level with the intermediate reference potential and outputs the resulting signal to the drive circuit 480.

When an NMOS transistor Tr10 changes to an off state, and a signal of "L" level with a high reference potential is supplied from an on/off detection circuit 80, a level shift circuit 440 converts the signal of "L" level with the high reference potential into one of "L" level with the intermediate reference potential and outputs the resulting signal to the drive circuit 480.

In this case, the drive circuit 480 outputs the signal of "L" level to the PMOS transistor Tr50 to bring the PMOS transistor Tr50 into the on state and outputs the signal of "L" level to the level shift circuit 460 to notify the level shift circuit 460 that the PMOS transistor Tr50 has changed to the on state.

The level shift circuit 460 converts the signal of "L" level with the intermediate reference potential into one of "L" level with the low reference potential and outputs the resulting signal to the drive circuit 490. In this case, since the drive circuit 490 is supplied with the signals of "L" level from the level shift circuit 460 and inverter INV20, it outputs a signal of "L" level to the NMOS transistor Tr60 to bring the NMOS transistor Tr60 into the off state. At the same time, the drive circuit 490 outputs the signal of "L" level to the level shift circuit 450 to keep the PMOS transistor Tr50 in the on state.

This causes a gate of the NMOS transistor Tr20 to be connected to the power supply terminal VDD via the PMOS transistor Tr50, and as a result, the NMOS transistor Tr20 is brought into the on state.

After that, when the on/off control signal changes from "L" level to "H" level, the control circuit 410 sequentially inverts the level of the signal with the inverters INV10 and INV20. The control circuit 410 inputs the obtained signal of "H" level to the drive circuit 490 on the low reference potential side and the level shift circuit 450 on the intermediate reference potential side.

The level shift circuit 450 converts the signal of "H" level with the low reference potential into one of "H" level with the intermediate reference potential and outputs the resulting signal to the drive circuit 480. In this case, the drive circuit 480 outputs the signal of "H" level to the PMOS transistor Tr50 to bring the PMOS transistor Tr50 into the off state and outputs the signal of "H" level to the level shift circuit 460 to make a notification that the PMOS transistor Tr50 has changed to the off state.

The level shift circuit 460 converts the signal of "H" level with the intermediate reference potential into one of "H" level with the low reference potential and outputs the resulting signal to the drive circuit 490. In this case, the drive circuit 490 outputs the signal of "H" level to the NMOS transistor Tr60 to bring the NMOS transistor Tr60 into the on state and outputs the signal of "H" level to the level shift circuit 450 to keep the PMOS transistor Tr50 in the off state.

This causes the gate of the NMOS transistor Tr20 to be connected to a ground terminal GND via the NMOS transistor Tr60, and as a result, the NMOS transistor Tr20 is brought into the off state.

As in the first embodiment, the control circuit 410 inputs the on/off control signal supplied from the control signal input terminal ON/OFF to the level shift circuit 450. Since the control circuit 410 needs to input the on/off control signal to the level shift circuit 460 after converting the signal into one with the intermediate reference potential, it inputs, to the level shift circuit 460, a signal output from the level shift circuit 450. An LX state determination circuit 100 outputs an LX state determination signal obtained by determining the state, i.e., potential of a node LX to the level shift circuits 450 and 460.

For this reason, similarly to the level shift circuits 30 to 50 (FIG. 1) according to the first embodiment, each of the level shift circuits 450 and 460 increases a driving current therein on the basis of a time when the on/off control signal changes. After that, the level shift circuit decreases the increased driving current on the basis of a time when the potential of the node LX changes.

Note that when the PMOS transistor Tr50 changes to the on state, and a drive circuit 60 is notified that the NMOS transistor Tr20 has changed to the on state, the NMOS transistor Tr10 remains in the off state, and the potential of the node LX does not change. Accordingly, in this case, a time when an increased driving current is decreased in the level shift circuit 460, which notifies the drive circuit 490 that the PMOS transistor Tr50 has changed to the on state, is set by a time constant CR for a CR circuit of an edge pulse circuit (one corresponding to the edge pulse circuit 210 of the level shift circuit 50 in FIG. 5) used to make a notification that the PMOS transistor Tr50 has changed to the on state.

As described above, according to this embodiment, it is possible to increase signal transfer speed and at the same time implement a decrease in current consumption and circuit scale. Also, this embodiment makes it possible to increase the gate threshold voltage of the NMOS transistor Tr20 and thus decrease the on-resistance of the NMOS transistor Tr20.

(4) Fourth Embodiment

Figure 8:
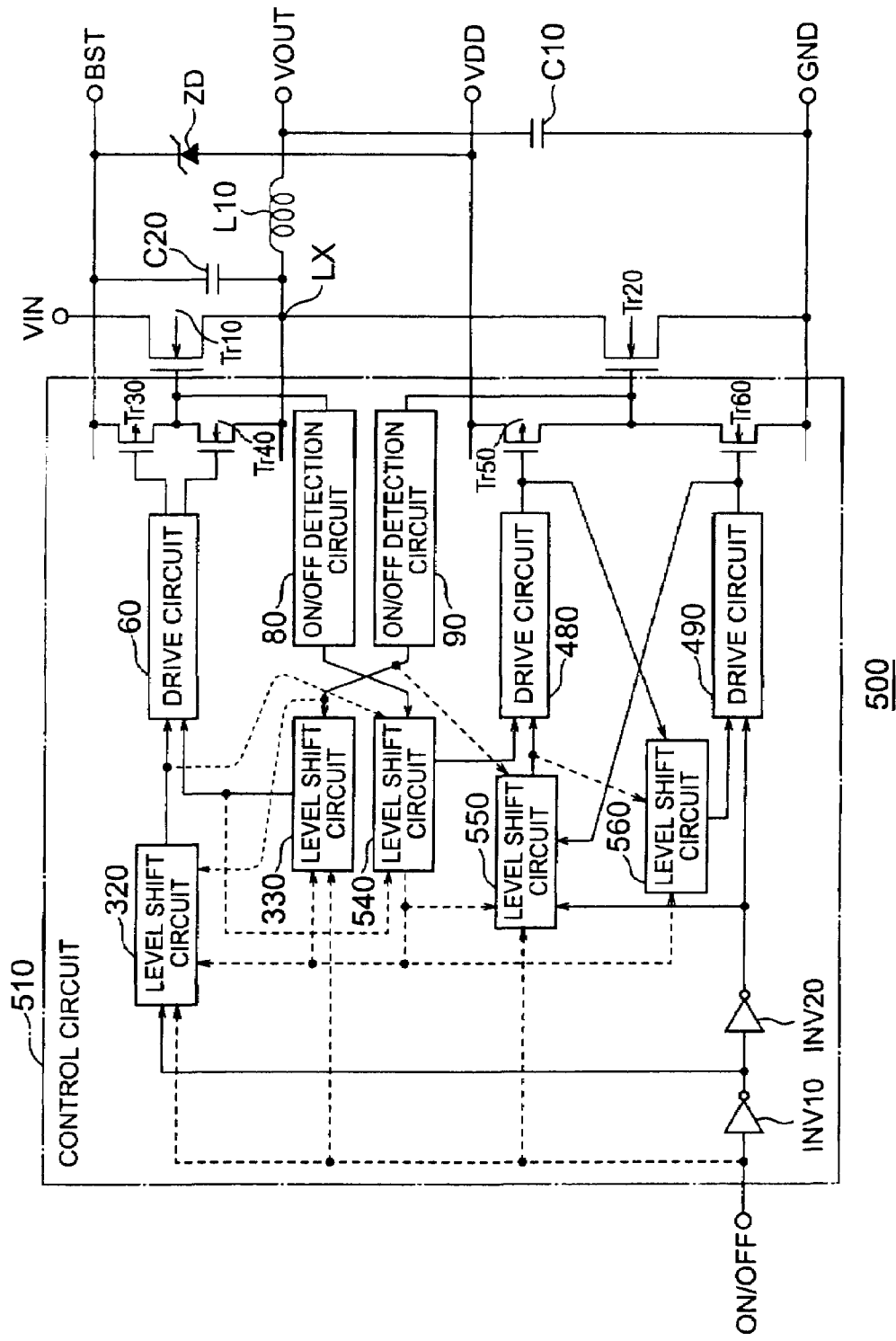
FIG. 8 is a block diagram showing the configuration of a DC-DC converter according to a fourth embodiment of the present invention.

FIG. 8 shows the configuration of a DC-DC converter 500 according to a fourth embodiment of the present invention. Note that the same components as those shown in FIGS. 1, 6, and 7 are denoted by the same reference numerals and that an explanation thereof will be omitted.

In this embodiment, a control circuit 510 has drive circuits 480 and 490 for separately driving a PMOS transistor Tr50 and an NMOS transistor Tr60. Also, the control circuit 510 determines a time when an increased driving current is decreased in each of level shift circuits 320, 330, and 540 to 560, using signals output from on/off detection circuits 80 and 90.

Note that as in the third embodiment, the level shift circuit 550 is formed by connecting the inverter INV50 connected at the preceding stage of the edge pulse circuit 110 in the level shift circuit 30 (FIG. 2) to the preceding stage of the edge pulse circuit 120 and that the level shift circuit 560 has the same configuration as the level shift circuit 50 (FIG. 5).

The level shift circuit 550 inputs a signal output from the on/off detection circuit 90 to an edge pulse circuit (one corresponding to the edge pulse circuit 120 of the level shift circuit 30 in FIG. 2) used to transfer an on/off control signal of "L" level (one for bringing an NMOS transistor Tr20 into an on state).

The edge pulse circuit increases a driving current at a time when the on/off control signal changes from "H" level to "L" level. After that, when the NMOS transistor Tr20 changes to the on state, and the potential of a node LX changes to 0 V, the signal output from the on/off detection circuit 90 changes from "L" level to "H" level. The edge pulse circuit decreases the increased driving current on the basis of the time when the signal changes to "H" level.

The level shift circuit 550 inputs a signal output from the on/off detection circuit 80 after converting the signal into one with an intermediate reference potential in the level shift circuit 540 to an edge pulse circuit (one corresponding to the edge pulse circuit 110 of the level shift circuit 30 in FIG. 2) used to transfer the on/off control signal of "H" level (one for bringing the NMOS transistor Tr20 into an off state).

The edge pulse circuit increases the driving current at a time when the on/off control signal changes from "L" level to "H" level. After that, when an NMOS transistor Tr10 changes to the on state, and the potential of the node LX changes to the same potential as that of a DC voltage applied from a voltage input terminal VIN, the signal output from the on/off detection circuit 80 via the level shift circuit 540 changes from "L" level to "H" level. The edge pulse circuit decreases the driving current on the basis of the time when the signal changes to "H" level.

The level shift circuit 560 inputs the signal output from the on/off detection circuit 80 after converting the signal into one with the intermediate reference potential in the level shift circuit 540 to an edge pulse circuit (one corresponding to the edge pulse circuit 220 of the level shift circuit 50 in FIG. 5) used to make a notification that the PMOS transistor Tr50 has changed to the off state (the NMOS transistor Tr20 has changed to the off state).

The edge pulse circuit increases a driving current at a time when the on/off control signal changes from "L" level to "H" level. After that, when the NMOS transistor Tr10 changes to the on state, and the potential of the node LX changes to the same potential as that of the DC voltage input from the voltage input terminal VIN, the signal output from the on/off detection circuit 80 via the level shift circuit 540 changes from "L" level to "H" level. The edge pulse circuit decreases the driving current on the basis of the time when the signal changes to "H" level.

Note that when a notification is made that the PMOS transistor Tr50 has changed to the on state (the NMOS transistor Tr20 has changed to the on state), the NMOS transistor Tr10 remains in the off state, and the potential of the node LX does not change. Accordingly, in this case, a time when the increased driving current is decreased is set by a time constant CR for a CR circuit of an edge pulse circuit (one corresponding to the edge pulse circuit 210 of the level shift circuit 50 in FIG. 5) used to make a notification that the PMOS transistor Tr50 has changed to the on state.

As described above, according to this embodiment, it is possible to increase signal transfer speed and at the same time implement a decrease in current consumption and circuit scale. Also, this embodiment makes it possible to increase the gate threshold voltage of the NMOS transistor Tr20 and thus decrease the on-resistance of the NMOS transistor Tr20. Additionally, this embodiment eliminates the need to provide the LX state determination circuit 100 (FIG. 7) and makes it possible to decrease CR circuits in the edge pulse circuits of the level shift circuits 320, 330, and 540 to 560.

Note that the above-described embodiments are merely examples and not intended to limit the present invention. For example, although the embodiments use the NMOS transistors Tr10 and Tr20 as switching elements, other various switching elements may be used instead.

What is claimed is:

1. A semiconductor device comprising:
   a control unit to be connected to first and second switching elements being connected in series between first and second terminals with a predetermined potential difference between the terminals and to control connection states of the first and second switching elements on the basis of an input signal such that when one of the first and second switching elements enters an off state, the other switching element enters an on state,
   wherein the control unit has
   a first drive unit to which a first reference potential is applied as a reference potential and which generates and outputs a first control signal for controlling the connection state of the first switching element on the basis of the input signal and a second control signal,
   a second drive unit to which a second reference potential different from the first reference potential is applied as a reference potential and which generates and outputs the second control signal for controlling the connection state of the second switching element on the basis of the input signal and the first control signal, and
   a conversion unit which changes a reference potential of the input signal to one of the first and second reference potentials and outputs the input signal to one of the first and second drive units, changes a reference potential of the first control signal outputted from the first drive unit to the second reference potential and outputs the first control signal to the second drive unit, and changes a reference potential of the second control signal outputted from the second drive unit to the first reference potential and outputs the second control signal to the first drive unit.

2. The semiconductor device according to claim 1, wherein after the conversion unit increases the current flowing through the conversion unit on the basis of the time when the input signal changes, the conversion unit decreases the current flowing through the conversion unit on the basis of a time when a potential of a junction of the first and second switching elements changes.

3. The semiconductor device according to claim 1, wherein the control unit further comprises a determination unit which determines a potential of a junction of the first and second switching elements, and wherein
   after the conversion unit increases the current flowing through the conversion unit on the basis of the time when the input signal changes, the conversion unit decreases the current flowing through the conversion unit on the basis of a time when a determination signal output from the determination unit changes.

4. The semiconductor device according to claim 3, wherein the conversion unit comprises
   first and second transistors whose gates are connected to an input terminal of the conversion unit,
   first and second constant current sources connected to one end of the first and second transistors, respectively,
   third and fourth transistors connected in parallel to the first and second constant current sources, respectively, and
   first and second edge pulse circuits connected to gates of the third and fourth transistors, respectively, which bring the third and fourth transistors into the on state on the basis of the time when the input signal changes and, after that, bring the third and fourth transistors into the off state on the basis of the time when the determination signal output from the determination unit changes.

5. The semiconductor device according to claim 4, wherein the conversion unit further comprises first to third current mirror circuits connected between the other end of the first transistor and the other end of the second transistor.

6. The semiconductor device according to claim 1, wherein after the conversion unit increases the current flowing through the conversion unit on the basis of the time when the input signal changes, the conversion unit decreases the current flowing through the conversion unit on the basis of a time when one of the first and second control signals changes.

7. The semiconductor device according to claim 6, wherein the conversion unit comprises
   first and second transistors whose gates are connected to an input terminal of the conversion unit,
   first and second constant current sources connected to one end of the first and second transistors, respectively,
   third and fourth transistors connected in parallel to the first and second constant current sources, respectively, and
   first and second edge pulse circuits connected to gates of the third and fourth transistors, respectively, which bring the third and fourth transistors into the on state on the basis of the time when the input signal changes and, after that, bring the third and fourth transistors into the off state on the basis of the time when the one of the first and second control signals changes.

8. The semiconductor device according to claim 7, wherein the conversion unit further comprises first to third current mirror circuits connected between the other end of the first transistor and the other end of the second transistor.

9. The semiconductor device according to claim 1, further comprising:
   first and second switching elements connected in series between the first and second terminals with a predetermined potential difference between the terminals.

10. The semiconductor device according to claim 9, further comprising:
    a smoothing unit which smoothes an AC voltage generated at a junction of the first and second switching elements and outputs an obtained DC voltage,
    wherein the smoothing unit is composed of a coil and a capacitor.

11. The semiconductor device according to claim 2, further comprising:
    first and second switching elements connected in series between the first and second terminals with a predetermined potential difference between the terminals; and
    a smoothing unit which smoothes an AC voltage generated at a junction of the first and second switching elements and outputs an obtained DC voltage.

12. The semiconductor device according to claim 3, further comprising:

first and second switching elements connected in series between the first and second terminals with a predetermined potential difference between the terminals; and a smoothing unit which smoothes an AC voltage generated at a junction of the first and second switching elements and outputs an obtained DC voltage.

13. The semiconductor device according to claim 4, further comprising:

first and second switching elements connected in series between the first and second terminals with a predetermined potential difference between the terminals; and a smoothing unit which smoothes an AC voltage generated at a junction of the first and second switching elements and outputs an obtained DC voltage.

14. The semiconductor device according to claim 5, further comprising:

first and second switching elements connected in series between the first and second terminals with a predetermined potential difference between the terminals; and a smoothing unit which smoothes an AC voltage generated at a junction of the first and second switching elements and outputs an obtained DC voltage.

15. The semiconductor device according to claim 6, further comprising:

first and second switching elements connected in series between the first and second terminals with a predetermined potential difference between the terminals; and a smoothing unit which smoothes an AC voltage generated at a junction of the first and second switching elements and outputs an obtained DC voltage.

16. The semiconductor device according to claim 7, further comprising:

first and second switching elements connected in series between the first and second terminals with a predetermined potential difference between the terminals; and a smoothing unit which smoothes an AC voltage generated at a junction of the first and second switching elements and outputs an obtained DC voltage.

17. The semiconductor device according to claim 8, further comprising:

first and second switching elements connected in series between the first and second terminals with a predetermined potential difference between the terminals; and a smoothing unit which smoothes an AC voltage generated at a junction of the first and second switching elements and outputs an obtained DC voltage.

18. The semiconductor device according to claim 11, wherein the smoothing unit is composed of a coil and a capacitor.

19. The semiconductor device according to claim 15, wherein the smoothing unit is composed of a coil and a capacitor.

20. The semiconductor device according to claim 16, wherein the smoothing unit is composed of a coil and a capacitor.

* * * * *